United States Patent
Lin et al.

(10) Patent No.: US 8,625,324 B2
(45) Date of Patent: Jan. 7, 2014

(54) NON-SALICIDE POLYSILICON FUSE

(75) Inventors: Sung-Chieh Lin, Zhubei (TW); David Yen, Chu-Bak (TW); Chi-Hsu Chiu, Taipei (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 207 days.

(21) Appl. No.: 13/107,441

(22) Filed: May 13, 2011

(65) Prior Publication Data

US 2012/0257435 A1 Oct. 11, 2012

Related U.S. Application Data

(60) Provisional application No. 61/473,937, filed on Apr. 11, 2011.

(51) Int. Cl.
G11C 17/00 (2006.01)
H01L 23/52 (2006.01)

(52) U.S. Cl.
USPC .......................................... 365/96; 257/529

(58) Field of Classification Search
USPC ......... 365/96, 225.7, 200; 257/529, 209, 530, 257/E23.149
See application file for complete search history.

(56) References Cited

U.S. PATENT DOCUMENTS

| | | | |
|---|---|---|---|
| 6,476,449 B1* | 11/2002 | Lin | 257/360 |
| 6,661,330 B1 | 12/2003 | Young | |
| 2006/0118908 A1* | 6/2006 | Erickson et al. | 257/536 |
| 2006/0197179 A1* | 9/2006 | Park et al. | 257/529 |
| 2009/0057818 A1* | 3/2009 | Kim et al. | 257/529 |
| 2010/0128511 A1* | 5/2010 | Worley | 365/96 |
| 2011/0002176 A1* | 1/2011 | Chang | 365/189.05 |
| 2011/0074538 A1* | 3/2011 | Wu et al. | 337/187 |

OTHER PUBLICATIONS

Sasaki, Takahiko et al., "Melt-Segregrate-Quench Programming of Electrical Fuse", IEEE 05CH37616 43rd Annual International Reliability Physics Symposium, San Jose, CA, 2005, pp. 347-351.
Tian, C. et al., "Reliability Qualification of COSI2 Electrical Fuse for 90NM Technology", IEEE 06CH37728 44th Annual International Reliability Physics Symposium, San Jose, CA, 2006, pp. 392-397.

* cited by examiner

Primary Examiner — Vanthu Nguyen
Assistant Examiner — Khamdan Alrobaie
(74) Attorney, Agent, or Firm — Lowe Hauptman & Ham, LLP

(57) ABSTRACT

The embodiments of methods and structures disclosed herein provide mechanisms of forming and programming a non-salicided polysilicon fuse. The non-salicided polysilicon fuse and a programming transistor form a one-time programmable (OTP) memory cell, which can be programmed with a low programming voltage.

20 Claims, 7 Drawing Sheets

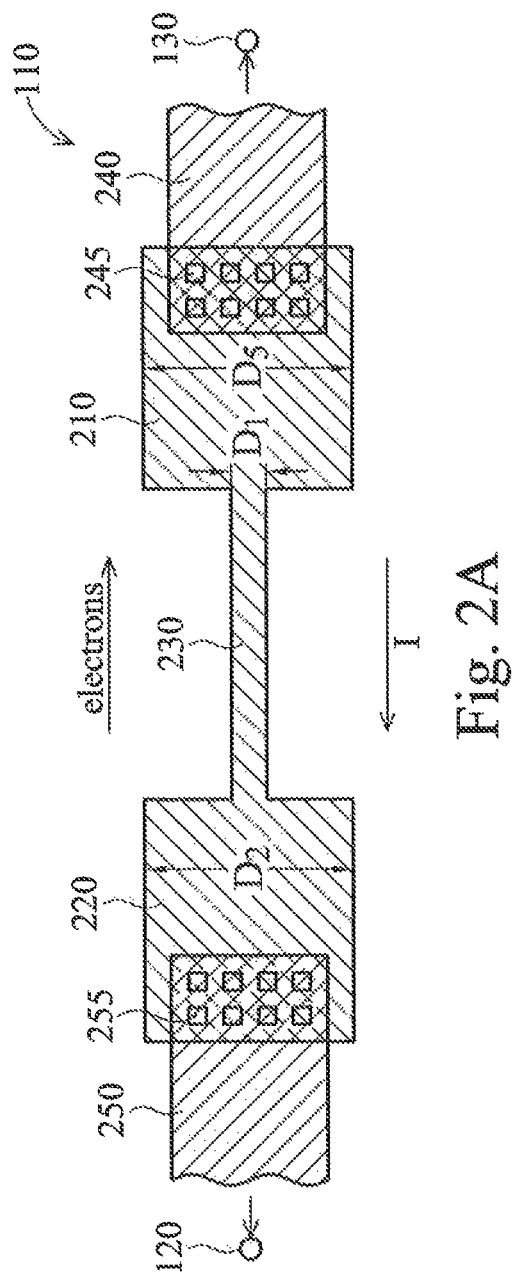
Fig. 2A
Fig. 2B

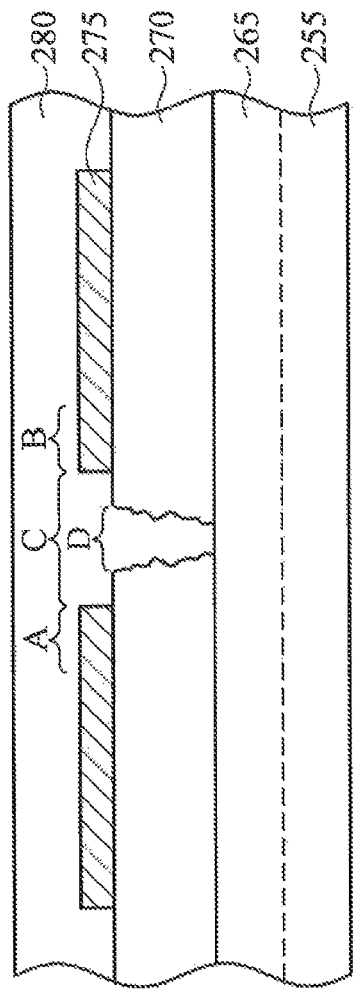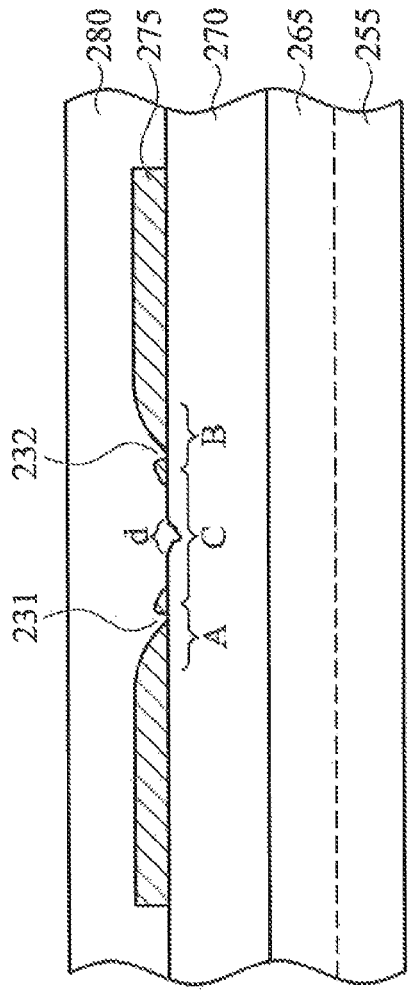

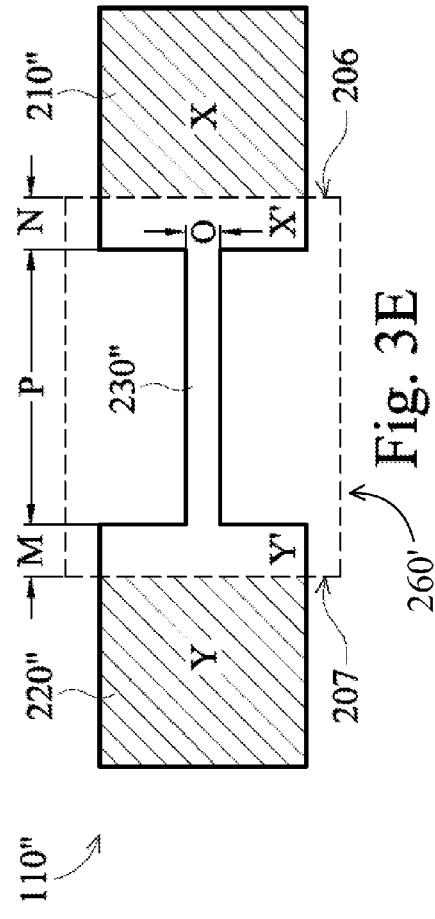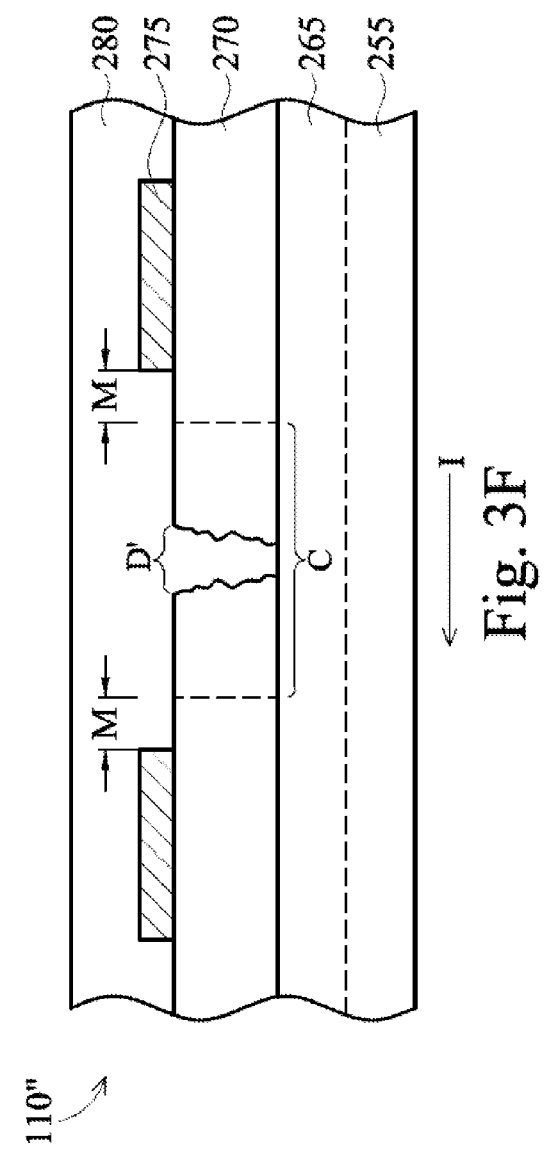

NON-SALICIDE POLYSILICON FUSE

CROSS-REFERENCE TO RELATED APPLICATIONS

The present application claims priority of U.S. Provisional Patent Application Ser. No. 61/473,937, filed on Apr. 11, 2011, which is incorporated herein by reference in its entirety.

FIELD

The present disclosure relates to an electrical fuse. Particularly, the disclosure relates to a polysilicon fuse.

BACKGROUND

In the semiconductor industry, fuse elements are widely used in integrated circuits for a variety of purposes. A fuse disconnected by passing an electrical current, or blowing, is referred to as an electrical fuse, or e-fuse. By selectively blowing fuses within an integrated circuit, which has multiple potential uses, a generic integrated circuit design may be economically manufactured and adapted to a variety of customer uses.

Fuses are incorporated in the design of the integrated circuits, and are selectively blown, for example, by passing an electrical current of a sufficient magnitude to cause melting or agglomeration, thereby creating a more resistive path or an open circuit. The process of selectively blowing fuses is referred to as "programming."

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2A shows a top view of the electrical fuse, in accordance with some embodiments.

FIG. 2B shows a top view of a blown fuse link 230, in accordance with some embodiments.

FIG. 3C shows that when the programming transistor connected to a cathode is turned on (ON state), a current is applied across the electrical fuse due to the voltage $V_{PGM}$ supplied at the anode, in accordance with some embodiments.

FIG. 3D shows poly-silicide agglomeration in regions A and/or B of an electrical fuse, in accordance with some embodiments.

FIG. 3E shows a top view of an electrical fuse with a fuse link, in accordance with some embodiments.

FIG. 3F shows a cross-sectional view of the electrical fuse of FIG. 3E, in accordance with some embodiments.

DETAILED DESCRIPTION

It is to be understood that the following description provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
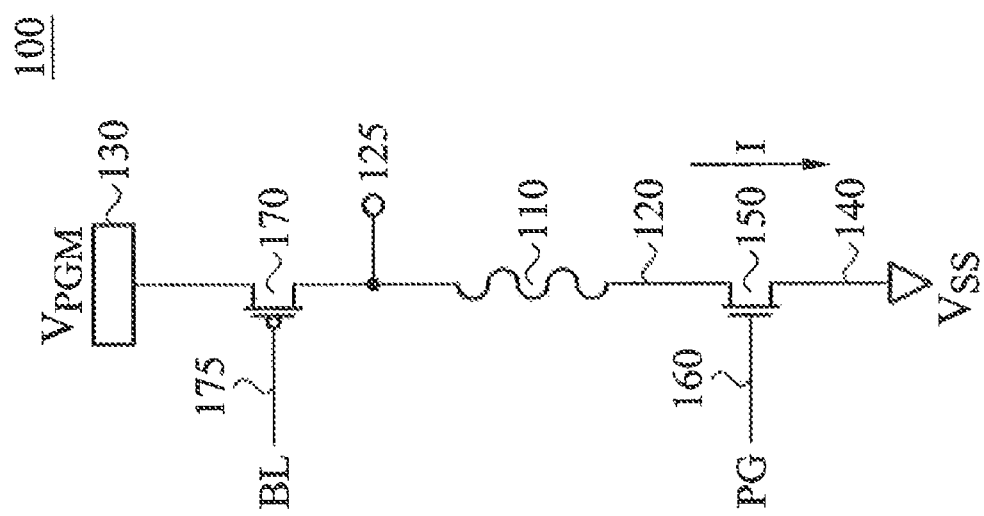
FIG. 1 shows a circuit diagram of a one-time programmable memory (OTP) cell, in accordance with some embodiments.

FIG. 1 shows a circuit diagram of a one-time programmable memory (OTP) cell 100, in accordance with some embodiments. The OTP cell 100 has a fuse 110, which can be a metal fuse or a polysilicon fuse, which can be made of salicided or non-salicided polysilicon. The fuse 110 is placed between a drain 120 of a programming transistor 150 and a voltage source 130, which supplies a programming voltage, $V_{PGM}$. The access of the voltage source 130 is controlled by a controlling transistor 170, in accordance with some embodiments. Alternatively, the controlling transistor 170 is not needed. In some embodiments, the programming voltage is the supply voltage, $V_{DD}$. The source 140 of the programming transistor 150 is connected to a ground 145 (or $V_{SS}$). In addition, a read node (RN) 125 is placed between the fuse 110 and the controlling transistor 170. Before fuse 110 is programmed (closed fuse 110), the resistance of the fuse 110 is at the resistance of the conductive material used to make fuse 100 and is relatively low in comparison to the resistivity after fuse 110 is blown. As a result, RN 125 can read a voltage, which is a relatively low. The OTP memory cell 100 is considered to store a low logic level (a Low).

The fuse is programmed by switching ON the controlling transistor 170. The controlling transistor 170 may be switched on (or turned on) by applying a signal BL (a zero volt) at gate 175 to allow fuse 110 to connect to the voltage source 130. The programming transistor 150 is also switched on by applying a signal PG at the gate 160. The signal PG applied is a voltage, a gate to source voltage $V_{GS}$, that can turn on transistor 150. When the transistor 150 is turned ON, a current I flows from voltage source 130 via transistor 170, first to the drain 120 of transistor 150 and then to the source 140 of transistor 150. Current I causes fuse 110 to heat up and blows fuse 110. Fuse 110 is "blown" by melting, agglomeration, or other mechanisms. When a metal or polysilicon fuse is blown, the fuse become discontinuous and the resistance of the fuse increases. Therefore, after fuse 110 is blown, fuse 110 has a much higher resistance before it is blown. With the fuse blown, the OTP memory cell 100 is considered being programmed. After memory cell 100 is programmed, the voltage read by RN 125 is high due to high resistance of the fuse 110. Therefore, the OTP memory cell 100 is considered to store a high logic level (a High).

FIG. 2A shows a top view of the electrical fuse 110, in accordance with some embodiments. Electrical fuse (or e-fuse) 110 has an anode 210 and a cathode 220. The Anode 210 and the cathode 220 are connected by a fuse link 230. The anode 210, the cathode 220, and the fuse link 230 may be made of a conductive material, such as metal, poly-silicide, or polysilicon, in accordance of some embodiments. Examples of metals that could be used to form e-fuse include, but are not limited to, Al, Al-alloy, Cu, Cu-alloy, etc. Examples of polysilicides used to form e-fuse include, but are not limited to, $CoSi_2$ (cobalt silicide), NiSi (nickel silicide), etc.

Anode 210 is connected to an upper conductive layer 240 via contacts or vias (or contacts/vias) 245, in accordance with some embodiments. The upper conductive layer 240 is connected to the voltage source 130, which could supply the programming voltage, $V_{PGM}$. Cathode 220 is connected to an upper conductive layer 250 via contacts or vias (or contacts/vias) 255. The conductive layer 250 is connected to the drain 120, of the programming transistor 150 of FIG. 1. Alternatively, the cathode 220 can be connected to the drain 120 directly without the upper conductive layer 250 and the contacts/vias 255. The upper conductive layer 240 and the upper conductive layer 250 can be made of metal. The cathode 220 and the anode 210 are connected to each other via a fuse link 230. The fuse link 230 has a width $D_1$, which is much smaller than the width $D_2$ of cathode 220 or the width $D_3$ of anode 210. $D_2$ may be larger or smaller than $D_3$. $D_2$ may also be about the same as $D_3$.

The narrower fuse link 230 has a resistance, R, higher than the resistance of either the wider anode 210 or the wider cathode 220. When the programming transistor 150 is turned ON, a current, I, flows from anode 210 to cathode 220 with the application of a $V_{PGM}$ at voltage source 130 (via the conductive layer 240), as shown in FIG. 2A. Electrons flow in an opposite direction of the current I. Due to the higher resistance of the fuse link 230, the fuse link 230 is heated due to the Joule effect. Equation (1) shows Joule's first law.

$$Q = I^2 Rt = V^2/Rt \quad (1)$$

Q represents the heat generated and t is the time passed. The heat generated in the fuse link 230 increases the temperature of the fuse link 230, which is enclosed by dielectric layers. If the temperature of the fuse link 230 becomes high enough, the fuse link 230 may melt, which could result in a discontinuous fuse link 230 with increased resistance. As mentioned above, the increased resistance of the melted fuse link 230 could indicate that the e-fuse 110 has been programmed. FIG. 2B shows a top view of a blown fuse link 230, in accordance with some embodiments. The melting of the fuse link 230 results in a discontinuous fuse link 230, which has a higher resistance compared to before the fuse link 230 is blown.

Figure 2C:
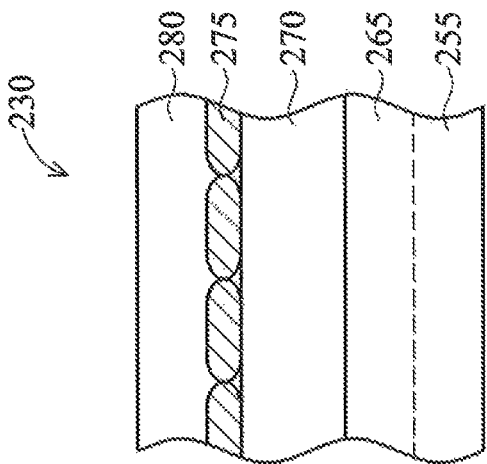
FIG. 2C shows a cross-sectional view of a portion of the fuse link before programming, in accordance with some embodiments.
Figure 2D:
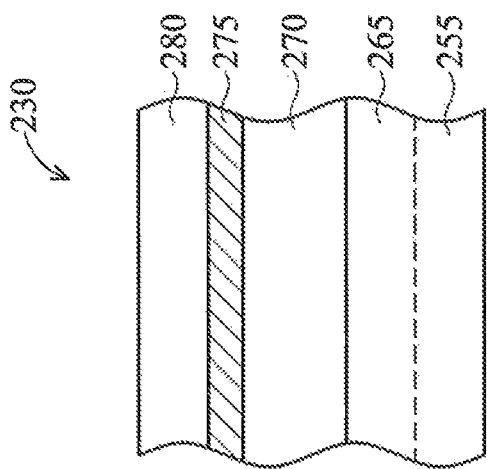
FIG. 2D shows a cross-sectional view of a portion of the fuse link after programming, in accordance with some embodiments.

The e-fuse may also agglomerate at an elevated temperature. For example, if the e-fuse is made of poly-silicide, such as NiSi, or $CoSi_2$, poly-silicide is less stable and may agglomerate at an elevated temperature. Poly-silicide agglomeration causes separation at the silicide grain boundaries, which may lead to local discontinuity and increased resistance of the fuse link locally. FIG. 2C shows a cross-sectional view of a portion of the fuse link 230 before programming, in accordance with some embodiments. A polysilicon layer 270 is deposited on a substrate 205. The polysilicon layer 270 may be doped or undoped. In some embodiment, substrate 205 includes a dielectric layer 265 that comes in contact with the polysilicon layer 270. The top portion of the polysilicon layer 270 is converted into a poly-silicide layer 275. The poly-silicide layer 275 is covered by a dielectric layer 280. FIG. 2D shows a cross-sectional view of a portion of the fuse link 230 after programming, in accordance with some embodiments. Due to the Joule effect resulting from passing a current I on the fuse link 230, the fuse link 230 generates heat and the temperature of the fuse link 230 increases. As mentioned above, poly-silicide is unstable at elevated temperature. As a result, the poly-silicide in the poly-silicide layer 275 agglomerates. The poly-silicide agglomeration results in separation of grain boundaries between silicide grains, such as grain 276 and grain 277. The discontinuity of poly-silicide increases the resistance of the fuse link 230. When the resistance of the fuse link 230 is increased to a certain level (defined by the specification), the e-fuse is considered programmed.

Due to the relatively low resistance of poly-silicide, such as in a range from about 30 ohms (Ω) to about 300Ω, the programming current of poly-silicide e-fuse is in a range from about 10 mA to about 20 mA. However, for a liquid crystal display (LCD) driver integrated circuit (IC), the operating current is relatively low due to the LCD driver being mounted on a glass substrate and the LCD using pins for external connections. In some embodiments, the operating current for an LCD driver IC is less than about 10 mA. In some embodiments, the operating current for an LCD driver IC is equal to or less than about 3 mA. Therefore, the operating current for the LCD driver is lower than the current required for programming poly-silicide fuse. Consequently, the conventional poly-silicide e-fuse cannot be used by an LCD driver ICs for customizing LCD. Although a floating gate OTP memory cell can be programmed at low current, such as at around 1 mA, the processing sequence of a floating gate OTP memory cell is more complex and requires adjusting the logic process flow to accommodate the requirement of the floating gate OTP memory cell. In addition, after a floating gate OTP memory cell is programmed, the memory cell needs to be baked to ensure data retention. Therefore, using a floating gate OTP memory cell for applications with a low programming current is not desirable.

Non-salicided polysilicon has a higher resistance than salicided polysilicon, such as between about 400Ω to about 4,000Ω, and can be considered a good candidate for such applications. With the higher resistance, the programming current may be lowered to less than about 10 mA. In order to increase the programming energy, the programming voltage ($V_{PGM}$) needs to be higher. In some embodiments, the programming voltage $V_{PMG}$ is equal to or greater than 3.3 V. In some embodiments, the programming voltage $V_{PMG}$ is equal to or greater than 5.0 V. Due to the relatively high programming voltage $V_{PGM}$, the programming transistor 150 for a non-salicided polysilicon fuse is an input/output (I/O) device (or transistor), not a core device.

Figure 3A:
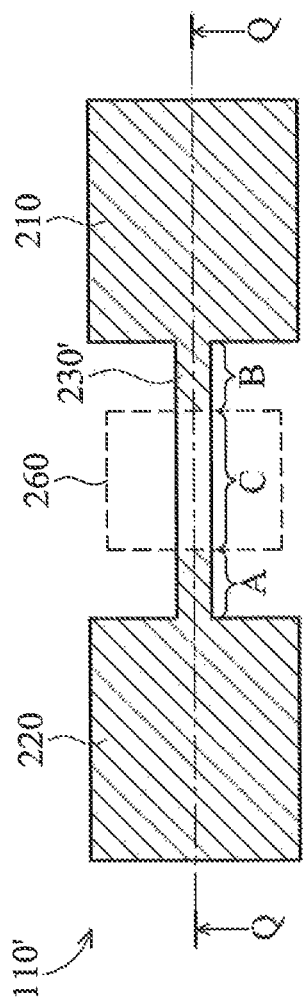
FIG. 3A shows a top view of an electrical fuse with a fuse link, in accordance with some embodiments.

FIG. 3A shows a top view of an electrical fuse 110' with a fuse link 230', in accordance with some embodiments. The electrical fuse 110' has an anode 210 and a cathode 220 connected to the fuse link 230'. The anode and the cathode are both made of poly-silicide. Portions A and B of fuse link 230' that connect to the cathode 220 and anode 210 are also made of poly-silicide. The remaining portion C of fuse link 230' is made of non-salicided polysilicon. As mentioned above, non-salicided polysilicon has a higher resistance than poly-silicide and is suitable for low current applications. FIG. 3A shows a dielectric layer 260 covering the region C of fuse link 330 during silicide formation. The dielectric layer 260 prevents region C from having a silicide metal deposited, such as Co or Ni, which is used to form poly-silicide. As a result, the polysilicon in region C of fuse link 230' is not salicided. In some embodiments, the dielectric layer 260 is formed by a plasma enhanced chemical vapor deposition (PECVD) process. In some embodiments, the thickness of the dielectric layer is in a range from about 5 nm to about 200 nm.

Figure 3B:
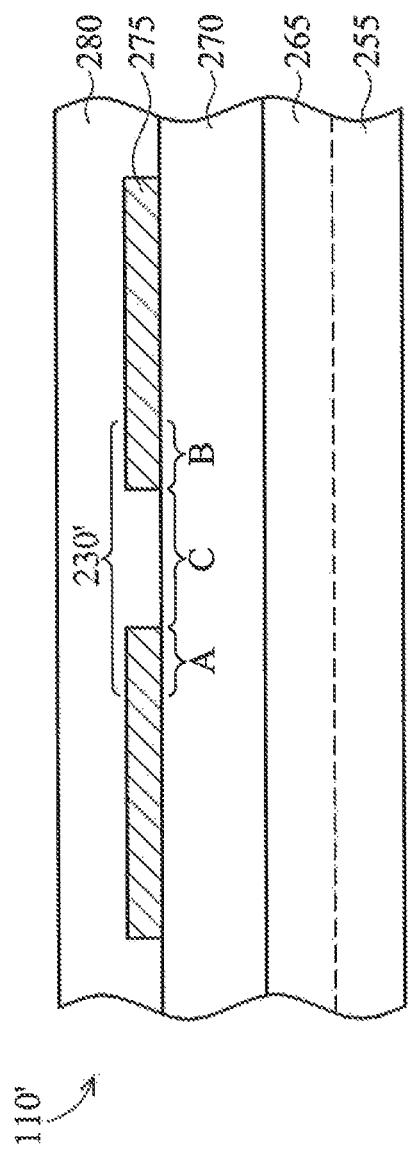
FIG. 3B shows a cross-sectional view of the electrical fuse of FIG. 3A cut along line QQ, in accordance with some embodiments.

FIG. 3B shows a cross-sectional view of the electrical fuse 110' of FIG. 3A cut along line QQ, in accordance with some embodiments. A poly-silicide layer 275 is formed on a polysilicon layer 270, which is deposited on a dielectric layer 265 of a substrate 205. FIG. 3B shows that the poly-silicide layer 275 is missing from region C of the fuse link 230'. FIG. 3C shows that when the programming transistor, such as transistor 150 of FIG. 1, connected to the cathode 220 is turned ON, a current I' is applied across the electrical fuse 110' due to the voltage $V_{PGM}$ supplied at the anode 210, in accordance with some embodiments. The current I' causes the fuse link 230' to heat up and to eventually melt a region D of the polysilicon region C of the fuse link 230', in accordance with some embodiments. As mentioned above, the electrical fuse 110' shown in FIGS. 3A and 3B is covered by a dielectric layer 280 when the manufacturing of the integrated circuit (IC) is completed, in accordance with some embodiments. The dielectric layer 280 covering the electrical fuse 110' traps the heat (or energy) generated. The trapped heat increases the temperature of the fuse link 230'. Region C of fuse link 230' has a higher resistance compared to regions A and B, because it is not salicided. Therefore, region C would generate more heat, according to Joule's first law described above. As a result, region D of the region C of the polysilicon layer 270 is melted and becomes discontinuous. As a result, the electrical fuse 110' is blown (or programmed).

However, as mentioned above, poly-silicide has a tendency to agglomerate at higher temperature. Poly-silicide agglomeration can lead to separation of silicide grain boundaries in regions A and/or B of fuse link 230', in accordance with some embodiments. Such separation of silicide grain boundaries could result in increased resistances in regions A and/or B of fuse link 230', which could consume energy intended to melt the polysilicon in region C. The poly-silicide agglomeration in regions A and/or B could significantly increases the resistances in regions A and/or B that there is not sufficient energy (or heat) for significant (or substantial) melting of the polysilicon layer 270 in region C. Instead, a significant amount of energy is consumed in heating the polysilicon layer 270 between separated silicide grain boundaries. FIG. 3D shows poly-silicide agglomeration in regions A and/or B of electrical fuse 110', in accordance with some embodiments. Grain boundary separation occurs in location 231 of region A and/or 232 of region B. The increased resistances at location 231 and/or location 232 would cause significant voltage drops across these two areas. In addition, the increased resistances at location 231 and/or location 232 would cause the polysilicon layer 270 under location 231 and/or location 232 to heat up and may even cause a partial melting of the areas. Since regions A and B are close to the cathode 220 an anode 210, which have large poly-silicide areas and are highly conductive, the polysilicon layer 270 under the separated grain boundaries in regions A and/or B might not melt significantly, since the heat generated could be quickly dissipated via large areas of poly-silicide connected to regions A and B.

Due to the significant voltage drop(s) near locations 231 and 232, and energy consumed near these locations, there might not be enough heat generated in region C of fuse link 230' to melt a portion of the polysilicon layer 270 in region C. In some embodiments, some small amount of melting in region D' of the region C may occur, as shown in FIG. 3D. However, the melting of region D' in region C becomes uncertain and uncontrollable, since it may or may not occur due to silicide agglomeration.

Blowing a fuse of an OTP should be precise and consistent, which makes e-fuse programming definite. Based on the discussion above, if the fuse link has portions that are salicided, the fuse-blowing operation might not be consistent. Therefore, it is desirable to form a polysilicon fuse with a fuse link completely not salicided. FIG. 3E shows a top view of an electrical fuse 110" with a fuse link 230", in accordance with some embodiments. The electrical fuse 110" includes an anode 210" and a cathode 220". The electrical fuse 110" is a polysilicon fuse. The majority of anode 210" and cathode 220" are salicided polysilicon to allow an electrical connection. FIG. 3E shows that areas X of the anode 210" and area Y of the cathode 220" are made of salicided polysilicon. However, area X' of the anode 210", area Y' of the cathode 220", and the entire fuse link 230" are made of non-salicided polysilicon. Areas X and X' of anode 210" are separated by dotted line 206. Areas Y and Y' of cathode 220" are separated by dotted line 207. Dotted lines 206 and 207 are boundaries of a dielectric layer 260' that covers the substrate during polysilicon silicide formation to prevent polysilicon in the covered areas from being salicided. The function of dielectric layer 260' is similar to dielectric layer 260.

FIG. 3E shows that the width of the fuse link 230" is "O" and the length of the fuse link 230" is "P", in accordance with some embodiments. The width "O" is in a range from about 10 nm to about 1 µm, in some embodiments. The lower limit of the width "O" is determined by the minimum critical dimension (CD) allowed for the polysilicon layer, in accordance with some embodiments. The wider the fuse link 230" is, the lower the resistance of the fuse link 230'. Therefore, the width "O" cannot be too wide for the e-fuse to work effectively. The width "O" is in a range from about 20 nm to about 0.5 µm, in some other embodiments. The resistance of the fuse link 230" is between about 400Ω to about 4,000Ω, in accordance with some embodiments.

The fuse link 230" is connected to the anode 210" and cathode 220", which are more conductive overall. If the length "P" of the fuse link 230" is too short, the fuse link 230" could have trouble reaching a sufficient high temperature to blow the fuse. However, if the length "P" of the fuse link 230" is too long, the real estate (surface area) taken up by the fuse link 230" would be too large, which is undesirable. The length "P" is in a range from about 50 nm to about 5 µm, in some embodiments. In some other embodiments, the length "P" is in a range from about 10 nm to about 10 µm.

FIG. 3E shows that the salicided portion of the anode 210' extends to a distance "N" from the edge of the fuse link 230" to prevent silicide agglomeration in the fuse link 230". For the same reason, the salicided cathode 220" extends to a distance "M" from the fuse link 230". In some embodiments, each of the distances N and M is in a range from about 2 nm to about 600 nm. Because the fuse link 230" and areas X' and Y' are kept non-salicided with the help of the dielectric layer 260' formed prior to silicide metal deposition to prevent silicide formation of polysilicon underneath, the alignment of the dielectric layer 260' and the electrical fuse 110' needs to be taken into consideration to ensure no exposure of fuse link 230" due to misalignment. To prevent an alignment error causing the exposure of the fuse link 230", a minimum distance for each of the M and N is needed.

FIG. 3F shows a cross-sectional view of the electrical fuse 110" of FIG. 3E, in accordance with some embodiments. FIG. 3F shows that the poly-silicide layer 275 of the anode 210" is at a distance N from the region C of fuse link 230" and the poly-silicide layer 275 of the cathode 220" is at a distance M from the region C of fuse link 230". The non-salicided fuse link 230" enables the electrical fuse 110" to blow at region D' in the fuse link 230" when a current I is applied when the programming transistor is turned ON and the anode is supplied with a programming voltage ($V_{PGM}$).

Figure 4:
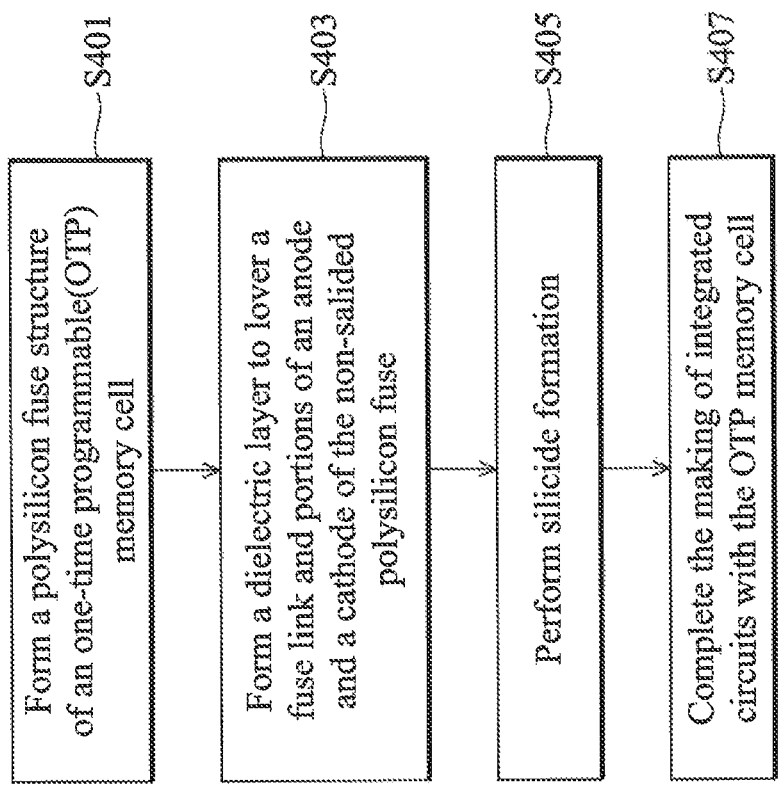
FIG. 4 shows a process flow of making a non-salicided polysilicon fuse of an OTP memory cell, in accordance with some embodiments.

FIG. 4 shows a process flow 400 of making a non-salicided polysilicon fuse of an OTP memory cell, in accordance with some embodiments. At operation 401, a polysilicon fuse structure is formed on a substrate. The polysilicon fuse structure includes an anode region and a cathode region. The anode and cathode regions are connected by a fuse link. In some embodiments, the substrate has a dielectric layer right underneath the polysilicon structure. An exemplary polysilicon fuse structure has been described above in FIG. 3E as structure 110". In some embodiments, the polysilicon layer used to form the polysilicon fuse structure is also used to form a gate of a programming transistor, formed by a gate first process, and connected to the non-salicided polysilicon fuse. In some other embodiments, the polysilicon layer used to form the polysilicon fuse structure is used to form a dummy gate of a replacement gate of a programming transistor, formed by a replacement gate process, and connected to the non-salicided polysilicon fuse.

Afterwards at operation 403, a dielectric is formed over the fuse link and portions of the anode and the cathode adjacent the fuse link. The formation of the dielectric layer may include deposition of the dielectric layer and patterning of the dielectric layer to expose the areas not covered by the dielectric layer. The patterning of the dielectric layer may include defining the area covered by the dielectric layer by a photoresist and then etching the dielectric layer not covered by the photoresist.

After the dielectric layer is formed and photoresist removed, silicide formation is performed to transform the exposed polysilicon surface to poly-silicide at operation 405. Silicide formation may include depositing a silicide metal, such as Ni or Co, on the substrate surface and then performing an annealing process to convert polysilicon in contact with the silicide metal into poly-silicide. In some embodiments, the annealing process is performed at a temperature equal to or greater than about 800° C. The annealing can be a multi-step process and can be performed in a rapid thermal processing (RTP) chamber or other annealing system for a period of time. In some embodiments, the duration is in a range from about 10 seconds to about 5 minutes. After silicide formation, additional processing is performed to complete the making of the integrated circuits with the non-salicided polysilicon fuse at operation 407. In some embodiments, the dielectric layer used to cover the non-salicided area is removed. The additional processing operations may also include forming interconnect and packaging of integrated circuit on the substrate that includes the non-salicided polysilicon fuse.

The embodiments of methods and structures disclosed herein provide mechanisms of forming and programming a non-salicided polysilicon fuse. The non-salicied polysilicon fuse and a programming transistor form a one-time programmable (OTP) memory cell, which can be programmed with a low programming voltage.

In some embodiments, a non-salicided polysilicon fuse is provided. The non-salicided polysilicon fuse includes an anode, and a first portion of the anode is made of salicided polysilicon and a second portion of the anode is made of non-salicided polysilicon. The non-salicided polysilicon fuse also includes a cathode, and a first portion of the cathode is made of salicided polysilicon and a second portion of the cathode is made of non-salicided polysilicon. The non-salicided polysilicon fuse further includes a fuse link, and the fuse link is made of non-salicided polysilicon. The fuse link is physically connected to the second portion of the anode and the second portion of the cathode.

In some other embodiments, a one-time programmable (OTP) memory cell is provided. The OTP memory cell includes a programming transistor, and a non-salicided polysilicon fuse. The non-salicided polysilicon fuse includes an anode. A first portion of the anode is made of salicided polysilicon and a second portion of the anode is made of non-salicided polysilicon. The non-salicided polysilicon fuse also includes a cathode. A first portion of the cathode is made of salicided polysilicon and a second portion of the cathode is made of non-salicided polysilicon. The cathode is connected to a drain of the programming transistor. The non-salicided polysilicon fuse further includes a fuse link. The fuse link is made of non-salicided polysilicon, and the fuse link is physically connected to the second portion of the anode and the second portion of the cathode.

In yet some other embodiments, a method of forming a non-salicided polysilicon fuse is provided. The method includes forming a polysilicon fuse structure on a substrate, and the polysilicon fuse structure includes an anode region, a cathode region, and a fuse link. The fuse link is between and connected to the anode region and the cathode region. The method also includes forming a dielectric layer to cover the fuse link, a first portion of the cathode region, and a first portion of the anode region. The method further includes performing silicide formation to convert polysilicon not covered by the dielectric layer into salicided polysilicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polysilicon fuse, comprising:
    an anode, wherein a first portion of the anode is made of salicided polysilicon and a second portion of the anode is made of non-salicided polysilicon;
    a cathode; wherein a first portion of the cathode is made of salicided polysilicon and a second portion of the cathode is made of non-salicided polysilicon; and
    a fuse link; wherein the fuse link is made of non-salicided polysilicon, and wherein the fuse link is physically connected to the anode at the second portion of the anode and to the second portion of the cathode.

2. The polysilicon fuse of claim 1, wherein the fuse link has a resistance in a range from 400 Ω to 4000 Ω.

3. The polysilicon fuse of claim 1, wherein the fuse link has a width in a range from 20 nm to 0.5 μm.

4. The polysilicon fuse of claim 1, wherein the fuse link has a length in a range from 50 nm to 5 μm.

5. The polysilicon fuse of claim 1, wherein a distance from an interface between the first and the second portions of the anode to the fuse link is in a range from 2 nm to 600 nm.

6. The polysilicon fuse of claim 1, wherein a distance from an interface between the first and the second portions of the cathode to the fuse link is in a range from 2 nm to 600 nm.

7. The polysilicon fuse of claim 1, wherein the anode is connected to a controlling transistor, wherein in the controlling transistor is coupled to a power supply and controls the supplying of power by the power supply.

8. The polysilicon fuse of claim 1, wherein the cathode is connected to a drain of a programming transistor, wherein the programming transistor controls the programming of the non-salicided polysilicon fuse.

9. The polysilicon fuse of claim 8, wherein a current flowing through the non-salicided polysilicon fuse is less than 10 mA when the programming transistor is turned on.

10. The polysilicon fuse of claim 9, wherein supply voltage of the power supply is equal to or greater than 5 V.

11. The polysilicon fuse of claim 8, wherein the programming transistor is an input/output device.

12. The non salicided polysilicon fuse of claim 1, wherein the anode is electrically connected to a power supply.

13. A one-time programmable (OTP) memory cell, comprising:
   a programming transistor; and
   a polysilicon fuse, comprising:
      an anode, wherein a first portion of the anode is made of salicided polysilicon and a second portion of the anode is made of non-salicided polysilicon,
      a cathode; wherein a first portion of the cathode is made of salicided polysilicon and a second portion of the cathode is made of non-salicided polysilicon, wherein the cathode is connected to a drain of the programming transistor, and
      a fuse link; wherein the fuse link is made of non-salicided polysilicon, and wherein the fuse link is physically connected to the anode at the second portion of the anode and to the second portion of the cathode.

14. The OTP memory cell of claim 13, wherein the programming transistor is an input/output device.

15. The OTP memory cell of claim 13, wherein the anode is connected to a controlling transistor, wherein in the controlling transistor is coupled to a power supply and controls the access of the power supply.

16. The OTP memory cell of claim 15, wherein a supply voltage of the power supply is equal to or greater than 5 V.

17. The OTP memory cell of claim 15, wherein the non-salicided polysilicon is programmed when the transistor is turned on, and wherein a current flowing through the non-salicided polysilicon fuse is equal to or less than 3 mA when the programming transistor is turned on.

18. A method of forming a polysilicon fuse, comprising:
   forming a polysilicon fuse structure on a substrate, wherein the polysilicon fuse structure includes an anode region, a cathode region, and a fuse link, and wherein the fuse link is between and connected to the anode region and the cathode region;
   forming a dielectric layer to cover the fuse link, a first portion of the cathode region, and a first portion of the anode region, wherein the fuse link is physically connected to the first portion of the anode region and to the cathode region; and
   performing silicide formation to convert polysilicon not covered by the dielectric layer into salicided polysilicon.

19. The method of claim 18, wherein the dielectric layer is deposited by physical enhanced chemical vapor deposition (PECVD), and wherein the dielectric layer has a thickness in a range from 5 nm to 200nm.

20. The method of claim 18, wherein each of a smallest distance between the fuse link and salicided polysilicon of the anode and a smallest distance between the fuse link and the salicided polysilicon of the cathode is in a range from 2 nm to 600nm.

\* \* \* \* \*